(12) United States Patent
Chung

(10) Patent No.: US 10,727,445 B2
(45) Date of Patent: Jul. 28, 2020

(54) ORGANIC LIGHT EMITTING DISPLAY PANEL AND DISPLAY DEVICE

(71) Applicant: BOE TECHNOLOGY GROUP CO., LTD., Beijing (CN)

(72) Inventor: Chiehhsing Chung, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 134 days.

(21) Appl. No.: 15/540,801

(22) PCT Filed: Aug. 22, 2016

(86) PCT No.: PCT/CN2016/096172
§ 371 (c)(1),
(2) Date: Jun. 29, 2017

(87) PCT Pub. No.: WO2017/118039
PCT Pub. Date: Jul. 13, 2017

(65) Prior Publication Data
US 2018/0019443 A1   Jan. 18, 2018

(30) Foreign Application Priority Data
Jan. 5, 2016   (CN) .................... 2016 2 0010197 U

(51) Int. Cl.
*H01L 51/00* (2006.01)
*H01L 51/52* (2006.01)
*H01L 27/32* (2006.01)

(52) U.S. Cl.
CPC ...... *H01L 51/5268* (2013.01); *H01L 51/5256* (2013.01); *H01L 27/3244* (2013.01); *H01L 51/0011* (2013.01)

(58) Field of Classification Search
CPC . H01L 51/5268; H01L 51/5256; H01L 27/32; H01L 27/3244; H01L 51/0011;
(Continued)

(56) References Cited

U.S. PATENT DOCUMENTS

2007/0126353 A1   6/2007  Kubota et al.
2011/0042676 A1*  2/2011  Ren .................... G02F 1/13624
                                                        257/59
(Continued)

FOREIGN PATENT DOCUMENTS

CN   102738403 A   10/2012
CN   103489888 A    1/2014
(Continued)

OTHER PUBLICATIONS

Search Report for International Patent Application No. PCT/CN2016/096172 dated Nov. 25, 2016.

*Primary Examiner* — Moin M Rahman
(74) *Attorney, Agent, or Firm* — Calfee, Halter & Griswold LLP

(57) ABSTRACT

An organic light emitting display panel and a display device are disclosed, which alleviate or eliminate the phenomena of colored edges and stripes, and reduce the effect of an over fuzzy pattern edge. The organic light emitting display panel includes a substrate, and pixels, which are formed on the substrate by an evaporation mask plate, and each of which is provided with an organic light emitting diode. The organic light emitting display panel further includes a TFE layer on the organic light emitting diode, a flexible blocking layer above the TFE layer, and at least a light diffuse layer between the flexible blocking layer and the organic light emitting diode.

12 Claims, 6 Drawing Sheets

(58) Field of Classification Search
CPC ............. H01L 27/3246; H01L 51/5278; H01L 51/0017; H01L 51/5012; H01L 51/56; H01L 27/3209; H01L 51/5234; H01L 27/3258; H01L 51/5218; H01L 2251/5392; H01L 27/3218; H01L 2227/323; H01L 51/525; H01L 51/5237; H01L 2251/53; G09G 3/3291; G09G 2300/0426
USPC ..... 257/13, 79–103, 918, 40, 642–643, 759; 438/22–47, 69, 493, 503, 507, 956
See application file for complete search history.

(56) References Cited

U.S. PATENT DOCUMENTS

| | | | |
|---|---|---|---|
| 2011/0042697 A1* | 2/2011 | Lee | H01L 27/322 257/89 |
| 2012/0256218 A1 | 10/2012 | Kwack et al. | |
| 2013/0320842 A1 | 12/2013 | Park et al. | |
| 2013/0328479 A1 | 12/2013 | Jung et al. | |
| 2014/0138630 A1 | 5/2014 | Lee et al. | |
| 2016/0204172 A1* | 7/2016 | Park | H01L 27/3248 257/40 |
| 2016/0315123 A1* | 10/2016 | Kim | H01L 51/5284 |
| 2017/0159910 A1* | 6/2017 | Seo | G02B 6/00 |

FOREIGN PATENT DOCUMENTS

| | | |
|---|---|---|
| CN | 103839962 A | 6/2014 |
| CN | 205248279 U | 5/2016 |
| KR | 20110058579 A | 6/2011 |
| KR | 20150082787 A | 7/2015 |

\* cited by examiner

ORGANIC LIGHT EMITTING DISPLAY PANEL AND DISPLAY DEVICE

RELATED APPLICATIONS

The present application is the U.S. national phase entry of PCT/CN2016/096172, with an international filing date of Aug. 22, 2016, which claims the benefit of Chinese Patent Application 201620010197.1, filed on Jan. 5, 2016, the entire disclosures of which are incorporated herein by reference.

TECHNICAL FIELD

The present disclosure relates to the field of display technology, and particularly to an organic light emitting display panel and a display device.

BACKGROUND

In view of the difficulty in the layout of an active matrix organic light emitting diode (AMOLED) with a high resolution, two pixel light emitting regions are formed simultaneously by evaporation through an opening in an evaporation mask plate. This generally leads to non-uniform arrangement of pixels in a sub-pixel rendering technique, and further leads to colored edges and stripes, as shown in FIG. 1.

There is a need in the art to alleviate or eliminate the phenomena of colored edges and stripes as described above.

SUMMARY

Embodiments of the present disclosure provide an organic light emitting display panel and a display device, which alleviate or eliminate the phenomena of colored edges and stripes, and reduce the effect of an over fuzzy pattern edge.

In an embodiment of the present disclosure, an organic light emitting display panel comprises a substrate; a plurality of pixels which are formed on the substrate by an evaporation mask plate, wherein each of the pixels is provided with an organic light emitting diode. The organic light emitting display panel further comprises a thin film encapsulation (TFE) layer which is arranged on the organic light emitting diode; a flexible blocking layer which is arranged above the TFE layer; and at least a light diffuse layer which is arranged between the flexible blocking layer and the organic light emitting diode.

In the organic light emitting display panel in the present embodiment, the organic light emitting display panel comprises the TFE layer on each organic light emitting diode, the flexible blocking layer over the TFE layer, and at least a light diffuse layer which is arranged between the flexible blocking layer and the organic light emitting diode. In the present disclosure embodiment, the light diffuse layer is arranged between the flexible blocking layer and the organic light emitting diode. As compared with the case a diffuse sheet is attached to an outer side of an encapsulation cover plate, the light diffuse layer is closer to the light emitting region. Besides, the distance between the light diffuse layer and the light emitting region can be adjusted, and the haze adjustment of the light diffuse layer can be optimized. The phenomena of colored edges and stripes are inhibited, and the effect of an over fuzzy pattern edge is effectively reduced.

As an example, the TFE layer comprises stacked films, and the light diffuse layer is arranged between any two neighboring films.

As an example, the TFE layer comprises stacked films, and light diffuse layers are arranged among multiple neighboring films.

As an example, the light diffuse layer is arranged between the TFE layer and the flexible blocking layer.

As an example, the light diffuse layer is arranged between the organic light emitting diode and the TFE layer.

As an example, the light diffuse layer is arranged between the TFE layer and the flexible blocking layer and between the organic light emitting diode and the TFE layer.

As an example, the organic light emitting display panel further comprises a light diffuse layer which is arranged on the flexible blocking layer.

As an example, in the stacked films, each film in the stacked films comprises organic films, inorganic films, or alternately arranged organic films and inorganic films.

As an example, the light diffuse layer, which is arranged in a same layer on each organic light emitting diode, is formed from a complete layer of light diffuse layer.

As an example, the light diffuse layer is a glue layer comprising light diffuse particles.

As an example, the light diffuse layer is a film which comprises concave and convex shapes of different heights and is formed by imprinting.

An embodiment of the present disclosure further provides a display device, which comprises the organic light emitting display panel as described.

DETAILED DESCRIPTION OF EMBODIMENTS

Figure 1:
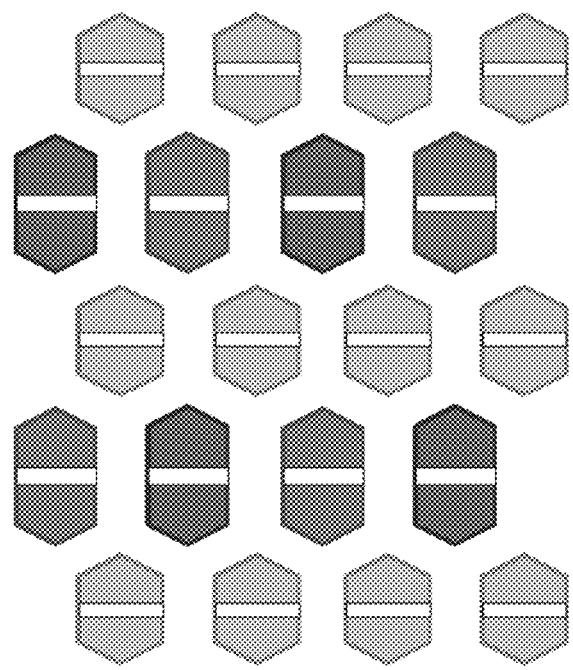
FIG. 1 is a schematic view for illustrating a pixel arrangement in a sub-pixel rendering technique of an organic light emitting diode display panel.
Figure 2:
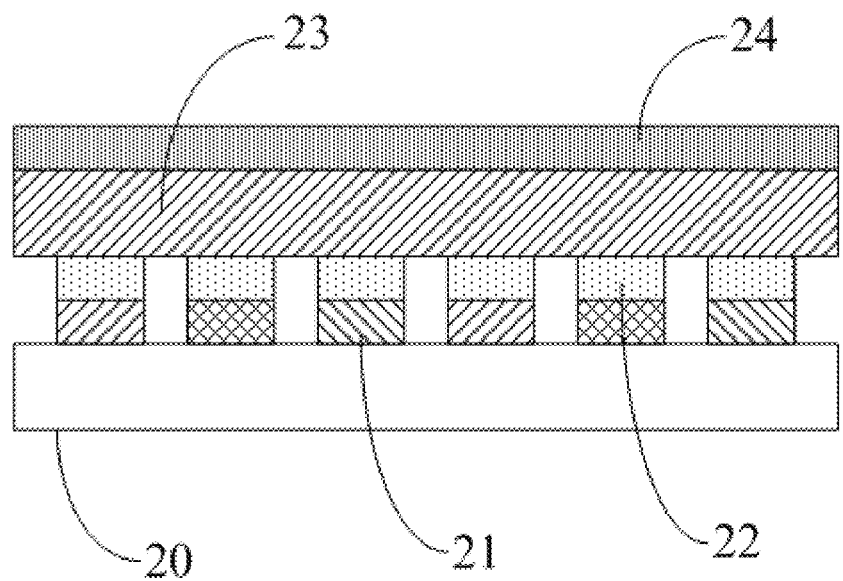
FIG. 2 is a schematic view for illustrating an organic light emitting display panel with improved colored edges and stripes.

In view of the non-uniform pixel arrangement and the phenomena of colored edges and stripes shown in FIG. 1, a diffuse sheet is attached. As shown in FIG. 2, an organic light emitting display panel comprises a substrate 20; a plurality of pixels 21, which are arranged on the substrate 20 and formed by an evaporation mask plate, and each of which is provided with an organic light emitting diode 22; and an encapsulation cover plate 23 which is arranged on the organic light emitting diode 22 and encapsulates the organic light emitting diode 22. In order to improve the phenomena of colored edges and stripes, a diffuse sheet 24 is attached to the encapsulation cover plate 23. By attaching the diffuse sheet to an outer side of the encapsulation cover plate, the phenomena of colored edges and stripes can be inhibited. However, this leads to problems such as an over fuzzy pattern edge, an increased thickness of the organic light emitting display panel module.

The present disclosure embodiment provides an organic light emitting display panel and a display device, which alleviate or eliminate the phenomena of colored edges and stripes, and reduce the effect of an over fuzzy pattern edge.

Specific embodiments of the present disclosure will be further described hereinafter with reference to the drawings and embodiments. The following embodiments are only used for explaining more clearly the technical solution of the present disclosure rather than limiting the protection scope of the present disclosure.

The shapes and sizes of components in the drawings are not drawn in a true scale, and only intend to illustrate the content of the present disclosure.

A specific of embodiment of the present disclosure provides an organic light emitting display panel, which comprises a substrate; a plurality of pixels which are formed on the substrate by an evaporation mask plate, wherein each of the pixels is provided with an organic light emitting diode. The organic light emitting display panel further comprises a TFE layer which is arranged on the organic light emitting diode; a flexible blocking layer which is arranged above the TFE layer; and at least a light diffuse layer which is arranged between the flexible blocking layer and the organic light emitting diode.

In the present disclosure embodiment, the light diffuse layer is arranged between the flexible blocking layer and the organic light emitting diode. As compared with the case the diffuse sheet is attached to the outer side of the encapsulation cover plate, the light diffuse layer is closer to the light emitting region. Besides, the distance between the light diffuse layer and the light emitting region can be adjusted, and the haze adjustment of the light diffuse layer can be optimized. The phenomena of colored edges and stripes are inhibited, and the effect of an over fuzzy pattern edge is effectively reduced.

The arrangement and position of the light diffuse layer will be described hereinafter with reference to specific embodiments of the present disclosure.

Figure 3:
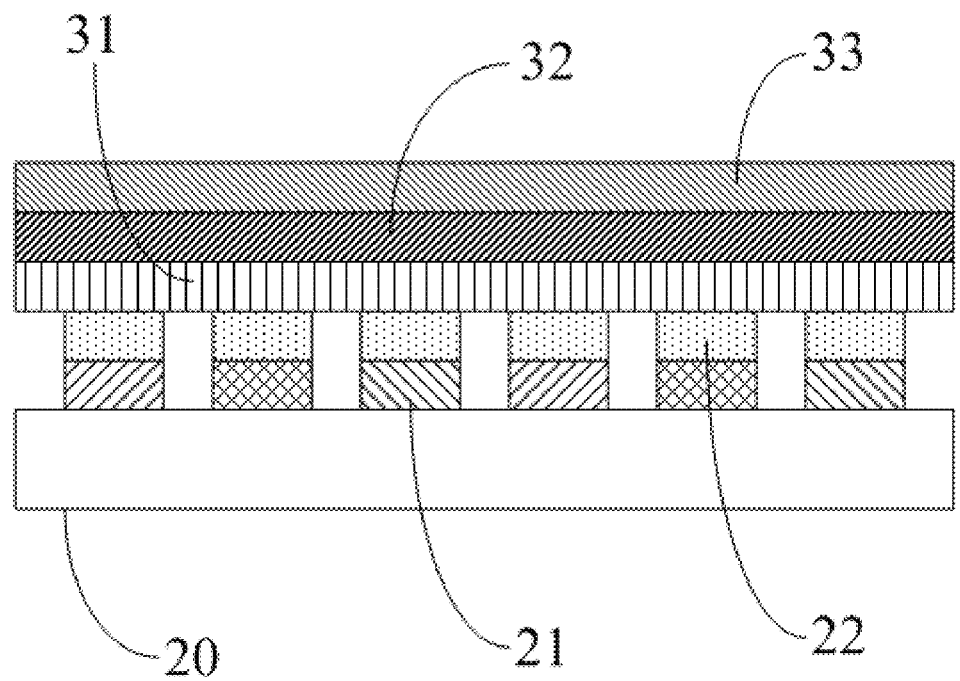
FIG. 3 is a structural diagram for illustrating an organic light emitting display panel in an embodiment of the present disclosure.

As shown in FIG. 3, in an embodiment of the present disclosure, an organic light emitting display panel comprises a substrate 20; a plurality of pixels 21, which are arranged on the substrate 20 and formed by an evaporation mask plate, and each of which is provided with an organic light emitting diode 22; a TFE layer 31 which is arranged on each organic light emitting diode 22; a flexible blocking layer 33 which is arranged over the TFE layer 31; and at least a light diffuse layer 32 which is arranged between the flexible blocking layer 33 and the TFE layer 31.

In a specific embodiment of the present disclosure, the material for the flexible blocking layer is for example silicon nitride (SiN), silicon oxide (SiO$_2$) or a composite material of SiN and SiO$_2$. In the specific embodiment of the present disclosure, the flexible blocking layer can be formed to a relatively small thickness, so that the effect on the thickness of the organic light emitting display panel module is reduced, as compared with the existing encapsulation cover plate.

Figure 4:
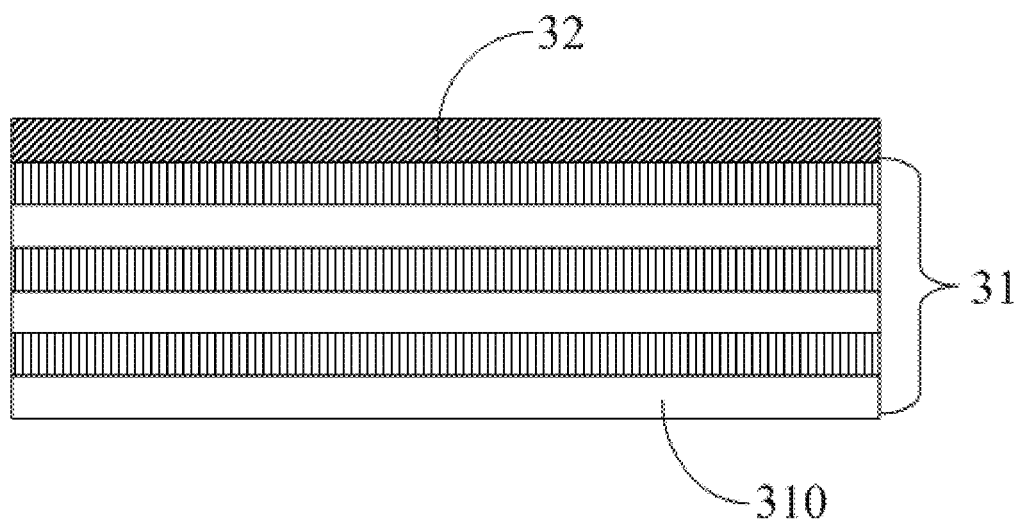
FIG. 4 is a structural diagram for illustrating a TFE layer and a light diffuse layer in an organic light emitting display panel in an embodiment of the present disclosure.

In a specific embodiment of the present disclosure, the TFE layer comprises stacked films. In this case, the light diffuse layer 32 is arranged as the uppermost layer in the stacked films, as shown in FIG. 4.

In implementations, the light diffuse layer can also be arranged inside the stacked films of the TFE layer. In an exemplary embodiment, the light diffuse layer is arranged between any two neighboring films. Alternatively, light diffuse layers are arranged among multiple neighboring films.

Figure 5:
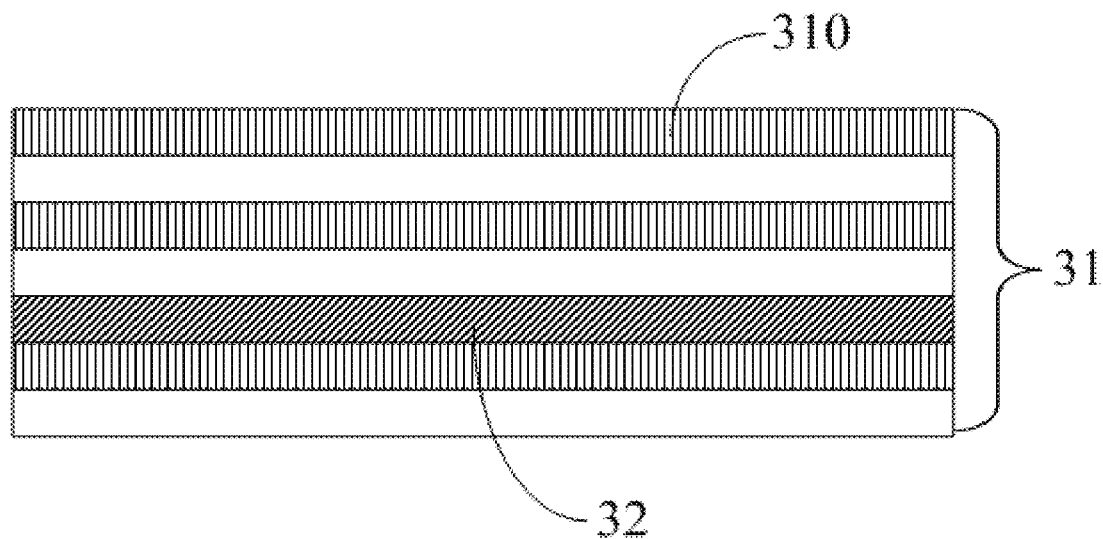
FIG. 5 is a structural diagram for illustrating a TFE layer and light diffuse layer in an organic light emitting display panel in an embodiment of the present disclosure.

In particular, as shown in FIG. 5, the TFE layer 31 comprises stacked films 310, and the light diffuse layer 32 is arranged between any two neighboring films 310. In implementations, each film in the stacked films 310 comprises stacked organic films, stacked inorganic films, or alternately arranged organic films and inorganic films.

In an exemplary embodiment, the organic film in the films 310 is an organic film which is prepared from polyimide, polyurea, polyamide acid, polyacrylate, polyester, polyethylene, or polypropylene.

The inorganic film in the films 310 is an inorganic film which is prepared from SiO$_x$, SiN$_x$, SiC$_x$N$_y$, SiO$_x$N$_y$, AlO$_x$, SnO$_2$, AlN, MgF$_2$, CaF$_2$, In$_2$O$_3$, or ITO.

Figure 6:
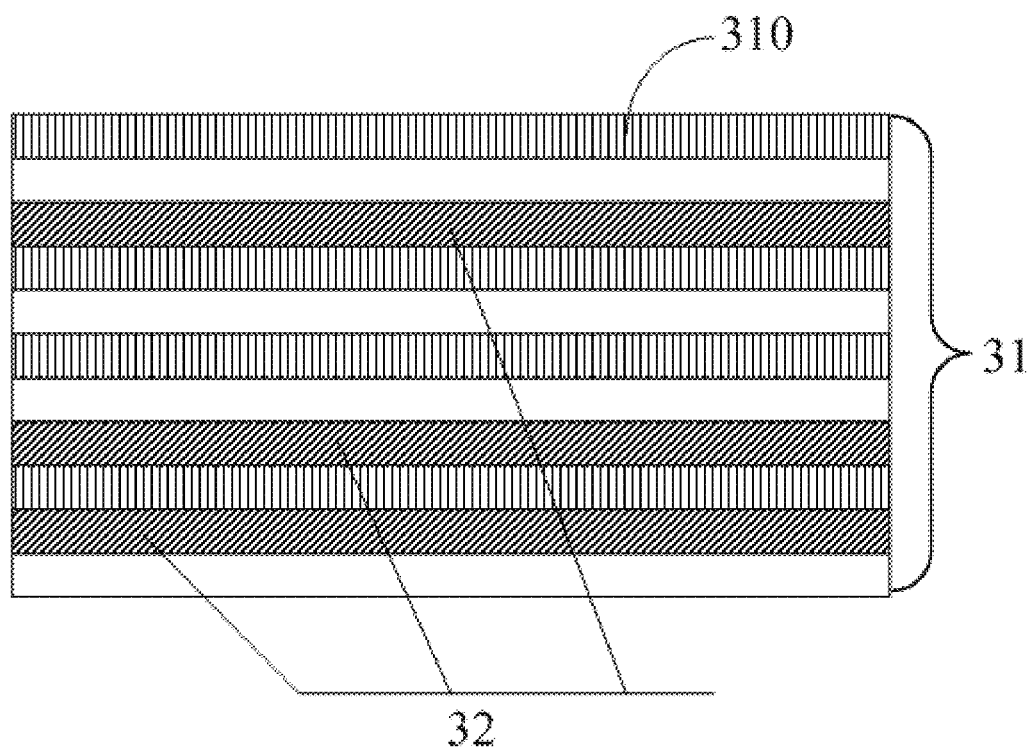
FIG. 6 is a structural diagram for illustrating a TFE layer and light diffuse layer in an organic light emitting display panel in an embodiment of the present disclosure.

As shown in FIG. 6, the TFE layer 31 comprises stacked films 310, and comprises multiple neighboring films 310. The light diffuse layer 32 is arranged between two neighboring films 310 in the above embodiment. In a further embodiment, light diffuse layers 32 are arranged among multiple neighboring films 310. For example, in FIG. 6, the TFE layer 31 comprises from the top to the bottom a first film, a second film, a third film, a fourth film, a fifth film, a sixth film, a seventh film, and an eighth film. The light diffuse layers 32 are arranged between the neighboring first film and second film, between the neighboring second film and third film, and between the neighboring sixth film and seventh film.

Figure 7:
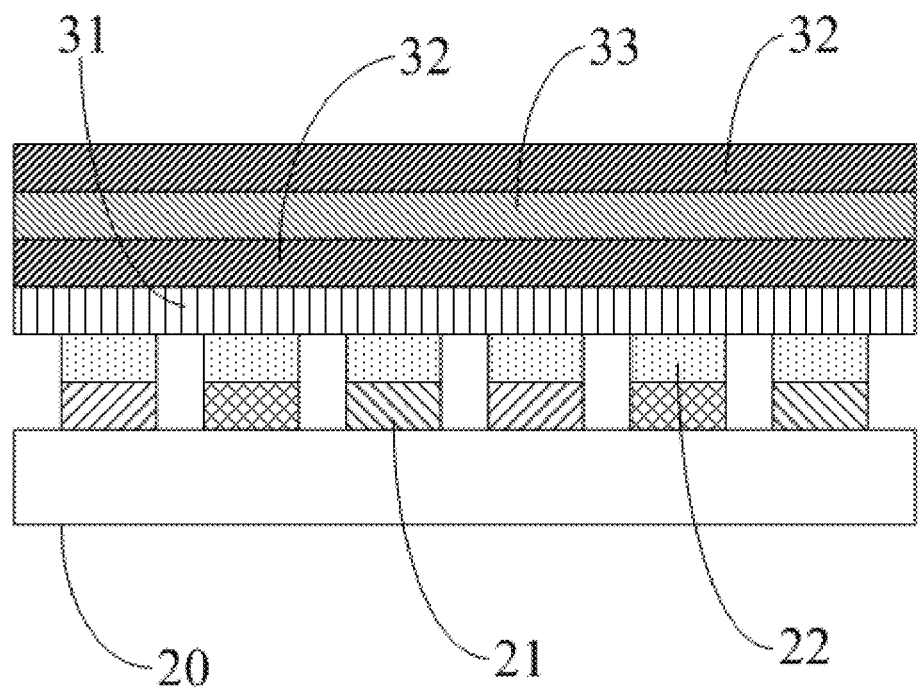
FIG. 7 is a structural diagram for illustrating an organic light emitting display panel in an embodiment of the present disclosure.

Furthermore, as shown in FIG. 7, in a specific embodiment of the present disclosure, the organic light emitting display panel comprises at least a light diffuse layer 32 which is arranged between the flexible blocking layer 33 and the TFE layer 31, and a light diffuse layer 32 which is arranged on the flexible blocking layer 33.

In this case, the light diffuse layer 32 between the flexible blocking layer 33 and the TFE layer 31 is arranged in a manner similar to the embodiment shown FIG. 4, FIG. 5, and FIG. 6, which is not repeated here for simplicity.

Figure 8:
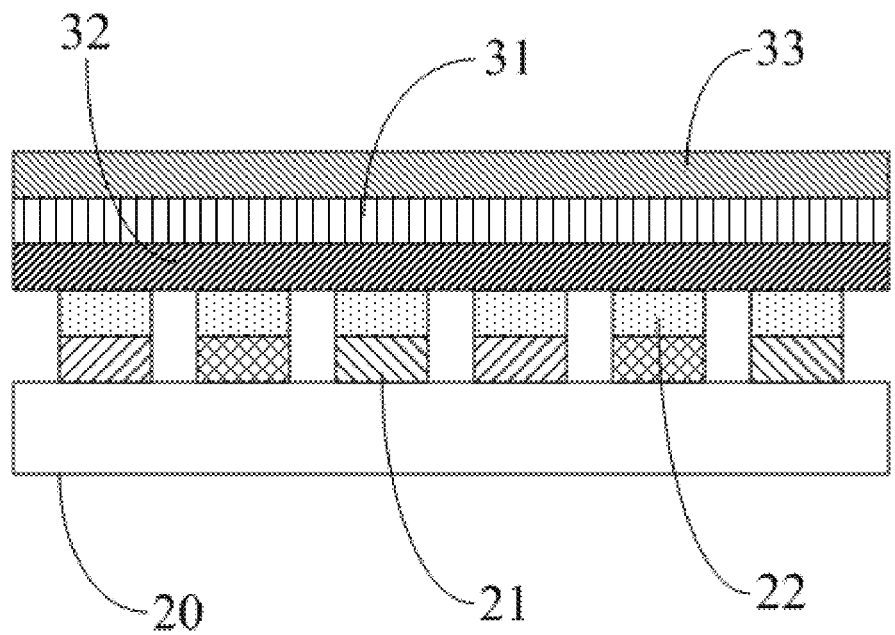
FIG. 8 is a structural diagram for illustrating an organic light emitting display panel in an embodiment of the present disclosure.

As shown in FIG. 8, in an embodiment of the present disclosure, the organic light emitting display panel comprises the substrate 20; the plurality of pixels 21, which are arranged on the substrate 20 and formed by an evaporation mask plate, and each of which is provided with the organic light emitting diode 22; the TFE layer 31 which is arranged on each organic light emitting diode 22; the flexible blocking layer 33 which is arranged over the TFE layer 31; and at least a light diffuse layer 32 which is arranged between the organic light emitting diode 22 and the TFE layer 31.

In a specific embodiment of the present disclosure, the TFE layer comprises stacked films. In this case, the light diffuse layer 32 is arranged as the lowest film in the stacked films, as shown in FIG. 9.

In implementations, the light diffuse layer can also be arranged inside the TFE layer comprising stacked films. In an exemplary embodiment, the light diffuse layer is arranged between any two neighboring films. In an exemplary embodiment, light diffuse layers are arranged among multiple neighboring films. The arrangement inside the TFE layer comprising stacked films is similar to the arrangement as described the above embodiments of the present disclosure, which is not repeated here for simplicity.

Figure 10:
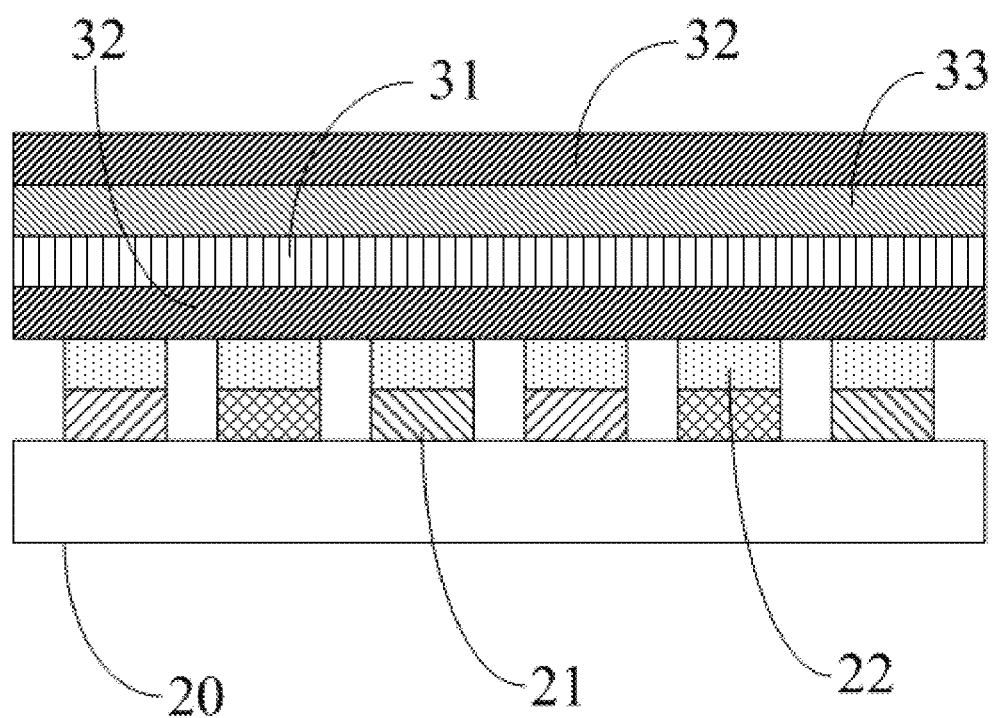
FIG. 10 is a structural diagram for illustrating an organic light emitting display panel in an embodiment of the present disclosure.

Furthermore, as shown in FIG. 10, in a specific embodiment of the present disclosure, the organic light emitting display panel comprises at least a light diffuse layer 32 which is arranged between the TFE layer 31 and the organic light emitting diode 22, and a light diffuse layer 32 which is arranged on the flexible blocking layer 33.

Figure 9:
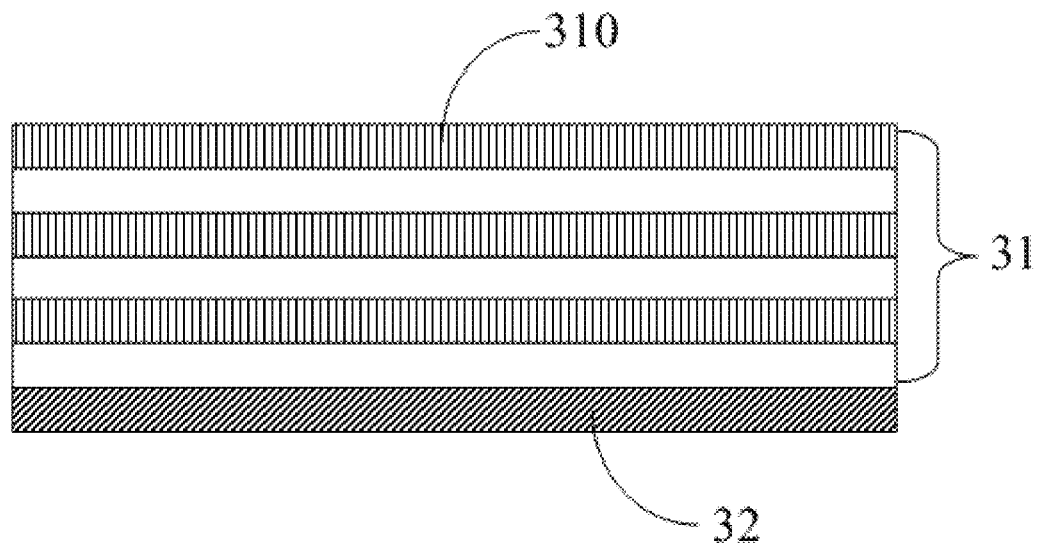
FIG. 9 is a structural diagram for illustrating a TFE layer and a light diffuse layer in an organic light emitting display panel in an embodiment of the present disclosure.

In this case, the arrangement of the light diffuse layer 32 which is arranged between the TFE layer 31 and the organic light emitting diode 22 is similar to the arrangement shown in FIG. 9, FIG. 5 and FIG. 6, which is not repeated here for simplicity.

Figure 11:
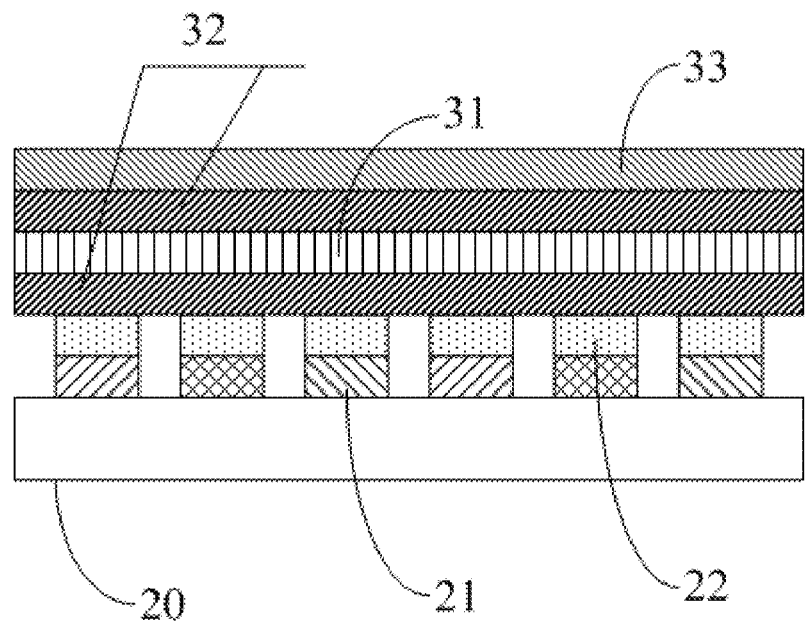
FIG. 11 is a structural diagram for illustrating an organic light emitting display panel in an embodiment of the present disclosure.

As shown in FIG. 11, in an embodiment of the present disclosure, an organic light emitting display panel comprises the substrate 20; a plurality of pixels 21, which are arranged on the substrate 20 and formed by an evaporation mask plate, and each of which is provided with an organic light emitting diode 22; the TFE layer 31 which is arranged on each organic light emitting diode 22; the flexible blocking layer 33 which is arranged over the TFE layer 31; at least a light diffuse layer 32 which is arranged between the TFE layer 31 and the flexible blocking layer 33, and at least a light diffuse layer 32 which is arranged between the organic light emitting diode 22 and the TFE layer 31.

The arrangement of the light diffuse layer 32 between the TFE layer 31 and the flexible blocking layer 33 is similar to the arrangement shown in the above embodiments, which is not repeated here for simplicity. The arrangement of the light diffuse layer 32 between the organic light emitting diode 22 and the TFE layer 31 is similar to the arrangement shown in the above embodiments, which is not repeated here for simplicity.

Figure 12:
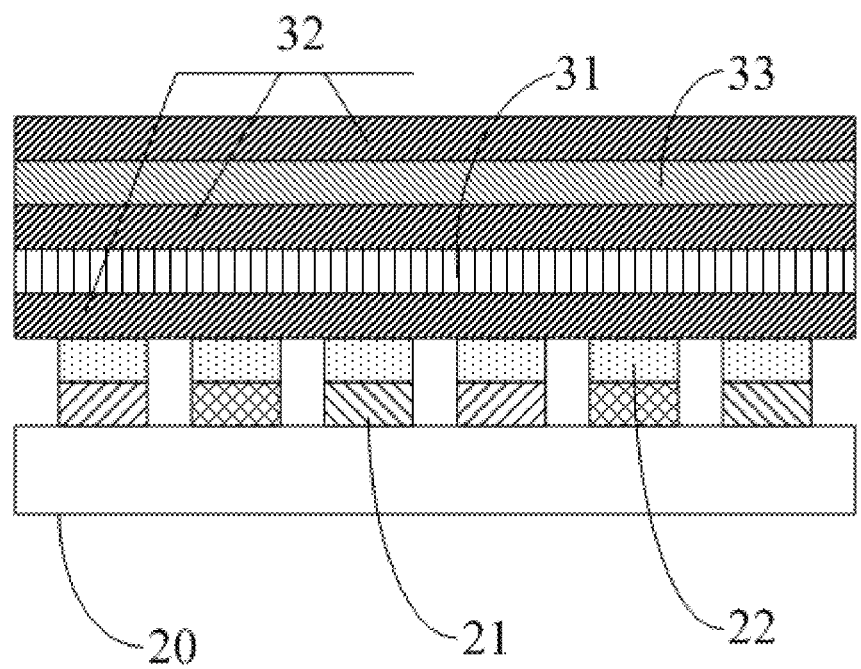
FIG. 12 is a structural diagram for illustrating an organic light emitting display panel in an embodiment of the present disclosure.

Furthermore, as shown in FIG. 12, in a specific embodiment of the present disclosure, an organic light emitting display panel comprises at least a light diffuse layer 32 which is arranged between the TFE layer 31 and the flexible blocking layer 33; at least a light diffuse layer 32 which is arranged between the organic light emitting diode 22 and the TFE layer 31; and the light diffuse layer 32 which is arranged on the flexible blocking layer 33.

In an exemplary embodiment, the light diffuse layer, which is arranged in a same layer on each organic light emitting diode, is formed from a complete layer of light diffuse layer. The light diffuse layer is a glue layer comprising light diffuse particles, or a film which comprises concave and convex shapes of different heights and is formed by imprinting.

In a specific embodiment of the present disclosure, it is further provided a display device, which comprises the above organic light emitting display panel. The display device can be a display device like organic light emitting diode display, organic light emitting diode TV, or electronic paper.

To sum up, specific embodiments of the present disclosure provide an organic light emitting display panel, which comprises a substrate, and a plurality of pixels, which are arranged on the substrate and formed by an evaporation mask plate, and each of which is provided with an organic light emitting diode. The organic light emitting display panel further comprises: a TFE layer which is arranged on each organic light emitting diode; a flexible blocking layer which is arranged over the TFE layer; and at least a light diffuse layer which is arranged between the flexible blocking layer and the organic light emitting diode. In specific embodiments of the present disclosure, the light diffuse layer is arranged between the flexible blocking layer and the organic light emitting diode.

As compared with the case a diffuse sheet is attached to an outer side of an encapsulation cover plate, the light diffuse layer is closer to the light emitting region. Besides, the distance between the light diffuse layer and the light emitting region can be adjusted, and the haze adjustment of the light diffuse layer can be optimized. The phenomena of colored edges and stripes are inhibited, and the effect of an over fuzzy pattern edge is effectively reduced.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. An organic light emitting display panel comprising:
   a substrate;
   a plurality of pixels formed on the substrate by an evaporation mask plate and spaced apart by inter-pixel regions, comprising respective organic light emitting diodes;
   a flexible blocking layer arranged on a same side of the organic light emitting diodes away from the substrate, wherein the flexible blocking layer is continuous and flexible, and covers the plurality of pixels and the inter-pixel regions between the plurality of pixels; and
   a TFE layer and at least one light diffuse layer arranged between the organic light emitting diodes and the flexible blocking layer, wherein the at least one light diffuse layer is continuous and covers the plurality of pixels and the inter-pixel regions between the plurality of pixels;
   wherein the TFE layer comprises stacked films, the stacked films comprise alternately arranged organic films and inorganic films, and the at least one light diffuse layer is arranged between two neighboring ones of the stacked films.

2. The organic light emitting display panel of claim 1, wherein the at least one light diffuse layer comprises a plurality of the light diffuse layers arranged among multiple neighboring ones of the stacked films.

3. The organic light emitting display panel of claim 1, further comprising a light diffuse layer arranged between the organic light emitting diodes and the TFE layer.

4. The organic light emitting display panel of claim 1, further comprising a light diffuse layer arranged between the TFE layer and the flexible blocking layer and another light diffuse layer arranged between the organic light emitting diodes and the TFE layer.

5. The organic light emitting display panel of claim 1, further comprising a light diffuse layer arranged on the flexible blocking layer.

6. The organic light emitting display panel of claim 1, wherein the light diffuse layer is distributed across the organic light emitting diodes of the plurality of pixels.

7. The organic light emitting display panel of claim 6, wherein the light diffuse layer is a glue layer comprising light diffuse particles.

8. The organic light emitting display panel of claim 6, wherein the light diffuse layer is a film comprising concave and convex shapes of different heights and is formed by imprinting.

9. A display device, comprising the organic light emitting display panel of claim 1.

10. The organic light emitting display panel of claim 2, further comprising a light diffuse layer arranged on the flexible blocking layer.

11. The organic light emitting display panel of claim 3, further comprising a light diffuse layer arranged on the flexible blocking layer.

12. The organic light emitting display panel of claim 4, further comprising a light diffuse layer arranged on the flexible blocking layer.

\* \* \* \* \*